United States Patent [19]

Ohsawa

[11] Patent Number: 4,935,900
[45] Date of Patent: Jun. 19, 1990

[54] DYNAMIC RANDOM ACCESS MEMORY WITH A SELF-REFRESHING FUNCTION

[75] Inventor: Akira Ohsawa, Kyoto, Japan

[73] Assignee: Matsushita Electronics Corporation, Osaka, Japan

[21] Appl. No.: 225,291

[22] Filed: Jul. 27, 1988

[30] Foreign Application Priority Data

Jul. 27, 1987 [JP] Japan .................... 62-187192

[51] Int. Cl.⁵ .................................. G11C 7/00
[52] U.S. Cl. .......................... 365/222; 365/201; 371/38.1
[58] Field of Search ............. 365/222, 200, 201; 371/13, 21, 38

[56] References Cited

U.S. PATENT DOCUMENTS

| | | | |
|---|---|---|---|
| 4,333,167 | 6/1982 | McElroy | 365/222 |
| 4,412,314 | 10/1983 | Proebsting | 365/222 |
| 4,644,184 | 2/1987 | Miyawaki et al. | 307/269 |
| 4,682,306 | 7/1987 | Sakurai et al. | 365/222 |
| 4,694,454 | 9/1987 | Matsuura | 365/222 X |
| 4,748,627 | 5/1988 | Ohsawa | 365/222 X |
| 4,758,992 | 7/1988 | Taguchi | 365/222 |

FOREIGN PATENT DOCUMENTS 0116774 8/1984 European Pat. Off. .

Primary Examiner—Joseph A. Popek
Attorney, Agent, or Firm—Wenderoth, Lind & Ponack

[57] ABSTRACT

A dynamic random access memory includes a self-refreshing function, in which an error correction device for detecting and correcting an error in the data of the memory cell during the refreshing operation of the memory cell data is provided. The clock period of a control clock generator for controlling the refreshing and error correcting operation is made variable. Specifically, the clock period of the clock generator is maintained in the vicinity of a maximum acceptable value dependant on the pause time of the memory cell in response to an error detection signal generated at the time of error correction by the error correction device. According to this configuration, if the phase time of the memory cell is changed significantly due to the manufacturing process condition the refreshing operation can be effected at a period near the maximum acceptable value, so that the self-refreshing current consumption may be decreased. Furthermore, if the phase time varies depending on the change in the operating condition or characteristic changes due to the time passage, the clock period values in response to such change, so that it is possible to operate in the maximum self-refreshing period depending on the conditions, without-resulting in a malfunction in the refreshing operation.

12 Claims, 6 Drawing Sheets

DYNAMIC RANDOM ACCESS MEMORY WITH A SELF-REFRESHING FUNCTION

BACKGROUND OF THE INVENTION

This invention relates to a dynamic random access memory with a self-refreshing function.

As a large capacity memory device, a dynamic random access memory (DRAM) in which one MOS transistor and one capacitor compose each memory cell is advantageous and general.

In this type of memory device, an electric charge is stored in the capacitor, and the written information is judged to be a binary 0 or 1 depending on whether this charge is present or absent. However when allowed stand idle for a long period of time, the stored charge decreases due to the leakage current of the capacitor, and the written information may be lost. Therefore, before the stored charge has decreased below a predetermined level, the information is read out from the capacitor, and the same information is then written again into the capacitor in order to prevent the information from disappearance. This operation is called refreshing.

However, in conventional dynamic random access memory devices, it is indispensable to keep refreshing even when the information is neither read out from the capacitor nor written into the capacitor by supplying address signals and clock signals to the memory device. Such a refreshing function is performed by external circuits, and therefore, the memory system tends to be complicated.

Recently, in order to simplify the memory system, it has been proposed to perform refreshing by internal circuits which are fabricated into the memory device (for example, Nikkei Electronics, No. 215, p. 167, 1979; No. 418, p. 167, 1987). This system is called self-refreshing function.

A conventional self-refreshing function of dynamic random access memory device is described below.

A block diagram of a conventional dynamic random access memory device is shown in FIG. 7, in which a memory cell matrix 21 has plurality of memory cells of m rows×n columns. A row line selection circuit 22 selects any one of the row lines of the memory cell matrix 21. A sense-refreshing amplifier 23 refreshes the memory cells corresponding to the row line selected by the row line selection circuit 22. A self-refreshing clock generator 24 is self-activated in a predetermined period, and generates a series of self-refreshing clock pulses. A control clock generator 25 generates a series of control clock pulses in synchronism with the self-refreshing clock pulses. A refreshing address counter 26 stores the refreshing address.

The self-refreshing operation of the dynamic random access memory device shown in FIG. 7 is as follows.

First, by the control clock synchronized with the self-refreshing clock, memory cells corresponding to the row line address specified by the refreshing address counter 26 and selected by the row line selection circuit 22 are refreshed. Afterwards, the refreshing address counter 26 is incremented by 1 bit within 1 refreshing period. When this operation is repeated continuously, all memory cells are completely refreshed by executing self-refreshing in m periods in a memory device having a memory cell matrix of m rows×n columns.

The self-refreshing clock generator 24 generates a series of clock pulses by dividing the oscillator output having a predetermined period. Accordingly, the self-refreshing period, once determined, does not change significantly although it does vary somewhat depending on the temperature condition or the deviation of a supply voltage.

The mean current consumption during self-refreshing is nearly inversely proportional to the period of the self-refreshing clock. In order to decrease the current consumption, it is better to set a longer period of the self-refreshing clock. However, if this period is set longer than the value of dividing the pause time $T_H$ to the memory cell by the number of row lines m of the memory cell matrix, it is impossible to refresh all memory cells within the pause time $T_H$. Furthermore, the pause time $T_H$ decreases to about half when the ambient temperature is raised by 10° C., and it also varies significantly depending on the manufacturing process condition. Therefore, in order to execute the self-refreshing operation correctly, it is necessary to set the self-refreshing clock period to a shorter period with a sufficient margin of safety, which makes it difficult to decrease the current consumption.

It is hence difficult, in the dynamic random access memories having the conventional self-refreshing function, to achieve the mutually contradictory purposes of decreasing the current consumption during self-refreshing and improving the precision of the self-refreshing operation.

SUMMARY OF THE INVENTION

It is hence a primary object of this invention to present a dynamic random access memory realizing both a decrease in current consumption and an enhancement in the accuracy of the self-refreshing operation, by continually maintaining the self-refreshing period in the vicinity of the maximum value where a malfunction may not occur even when the pause time of the memory cell fluctuates or when the environmental temperature varies.

This invention may be briefly summarized as a dynamic random access memory which includes a memory cell matrix having a plurality of memory cells arranged in a matrix, a row line selection circuit and column selection circuit for selecting any one of the rows and columns of the memory cell matrix, a sense refreshing amplifier for reading out and refreshing any one of the memory cells selected among the memory cell matrix, an error correction circuit for detecting and correcting an error in the data of the selected memory cell, an address counter for storing the address of the memory cell to be corrected, a self-refreshing clock generator with a variable clock period, and a control clock generator for supplying control clock pulses to the address counter, row line selection circuit, column selection circuit, sense refreshing amplifier and error correction circuit by receiving the self-refreshing clock pulses from the self-refreshing clock generator, whereby the clock period of the self-refreshing clock generator is varied by the error detection signal delivered from the error correction circuit when the error correction circuit corrects an error.

According to this configuration, if an error occurs in the data being read out because the period self-refreshing is too long while executing the self-refreshing operation in a certain period $T_R$, the self-refreshing period $T_R$ may be shortened by the error detection signal delivered from the error correction circuit. Additionally, if the self-refreshing period $T_R$ is sufficiently shorter than the value calculated based on the pause time $T_H$ of the memory cell, when an error does not occur for many periods, the period $T_R$ may be extended in response to the absence of an error detection signal delivered from the error correction circuit.

By thus controlling the self-refreshing clock period $T_R$ in response to the error detection signal delivered from the error correction circuit, the period $T_R$ may be kept in the vicinity of the maximum value suitable for the actual pause time of the memory cell, so that the current consumption of the self-refreshing operation may be decreased.

Other features and objects of the present invention will be apparent from the following accompanying drawings.

DETAILED DESCRIPTION OF THE INVENTION

Figure 1:
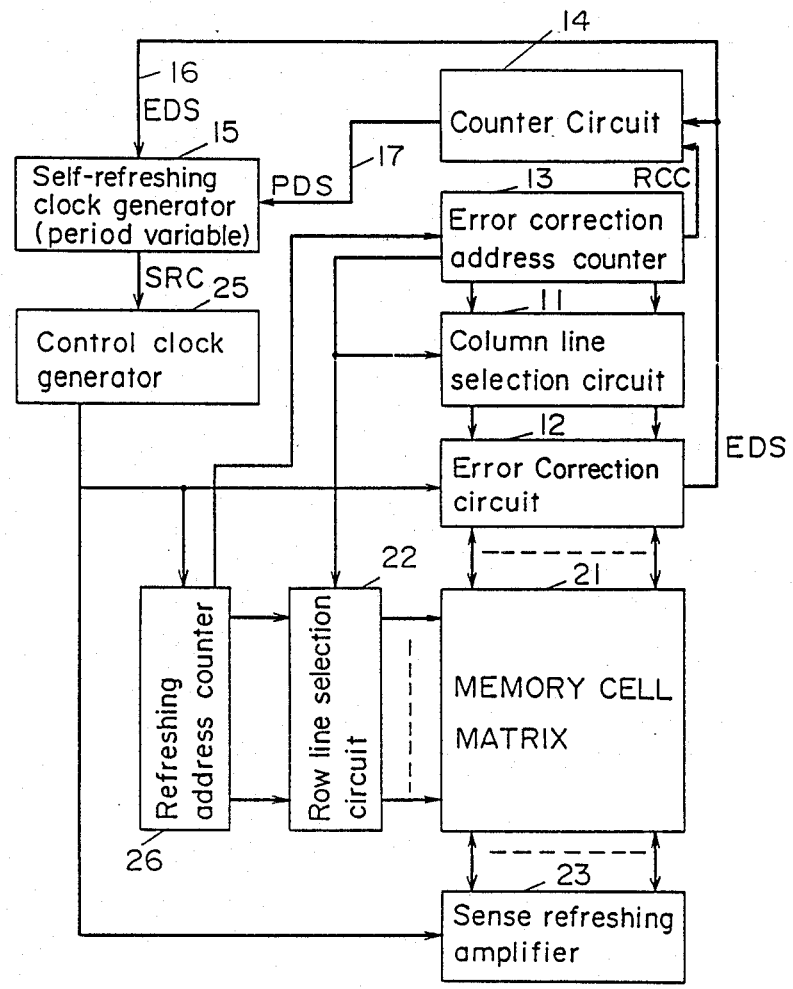
FIG. 1 is a block diagram showing a self-refreshing circuit of a dynamic random access memory according to one of the embodiments of this invention.
Figure 7:
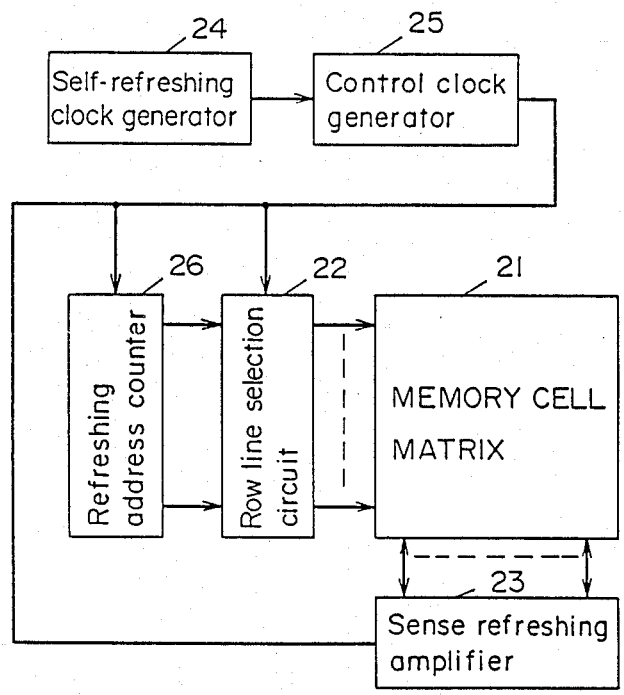
FIG. 7 is a block diagram of a conventional self-refreshing circuit.

Referring now to the drawings, one of the embodiments of this invention is described below. FIG. 1 is a block diagram showing a dynamic random access memory device in one embodiment of this invention, in which a memory cell matrix 21, a row line selection circuit 22, a sense refreshing amplifier 23, and a control clock generator 25 are substantially the same as those of the conventional circuit shown in FIG. 7. A refreshing address counter 26 stores the row line address to be refreshed. An error correction address counter 13 is synchronized with the refreshing address counter 26 and stores the column address to be corrected. The row line selection circuit 22 selects any one of the lines of the memory cell matrix 21 for refreshing selected memory cells, and the column line selection circuit 11 selects any one of the columns of the memory cell matrix for correcting selected memory cells. The error correction circuit 12 detects the error of the data read out from the memory cells by the sense refreshing amplifier 23 and rewrites the correct data into the memory cells, and then generates an error detection signal EDS when the error correction is executed. A counter circuit 14 receives a carry signal RCC from the error correction address counter 13, and is reset by the error detection signal EDS delivered from the error correction circuit 12. The clock period of the self-refreshing clock generator 15 is varied in response to the error detection signal EDS from the error correction circuit 12 or the control signal PDS from the counter circuit 14. Numerals 16, 17 denote control signal lines of the error detection signal EDS and the control signal PDS.

Figure 2:
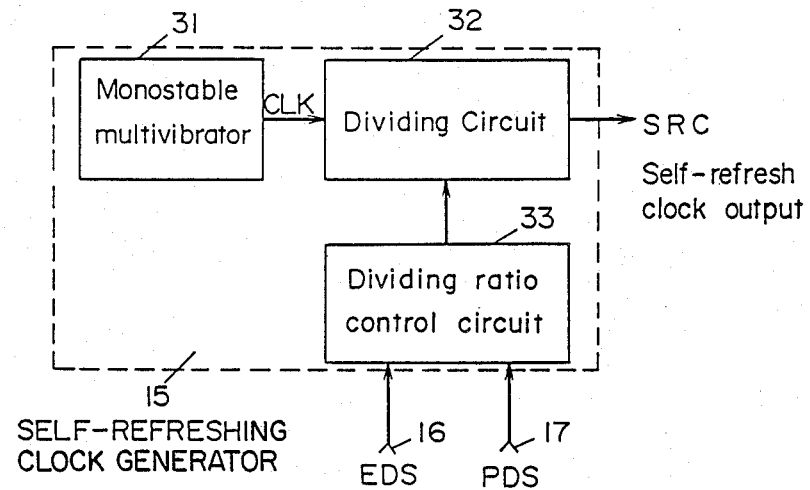
FIG. 2 is a block diagram showing the structure of a self-refreshing clock generator shown in FIG. 1.

FIG. 2 is a block diagram showing a detailed structure of the self-refreshing clock generator 15. The self-refreshing clock generator 15 is composed of monostable multivibrator 31 which is self-actuated, a dividing circuit 32 for dividing the output signal of the monostable multivibrator, and a dividing ratio control circuit 33 for varying the dividing ratio of the dividing circuit 32 in response to the error detection signal EDS and the control signal PDS supplied from control signal lines 16, 17.

Figure 3:
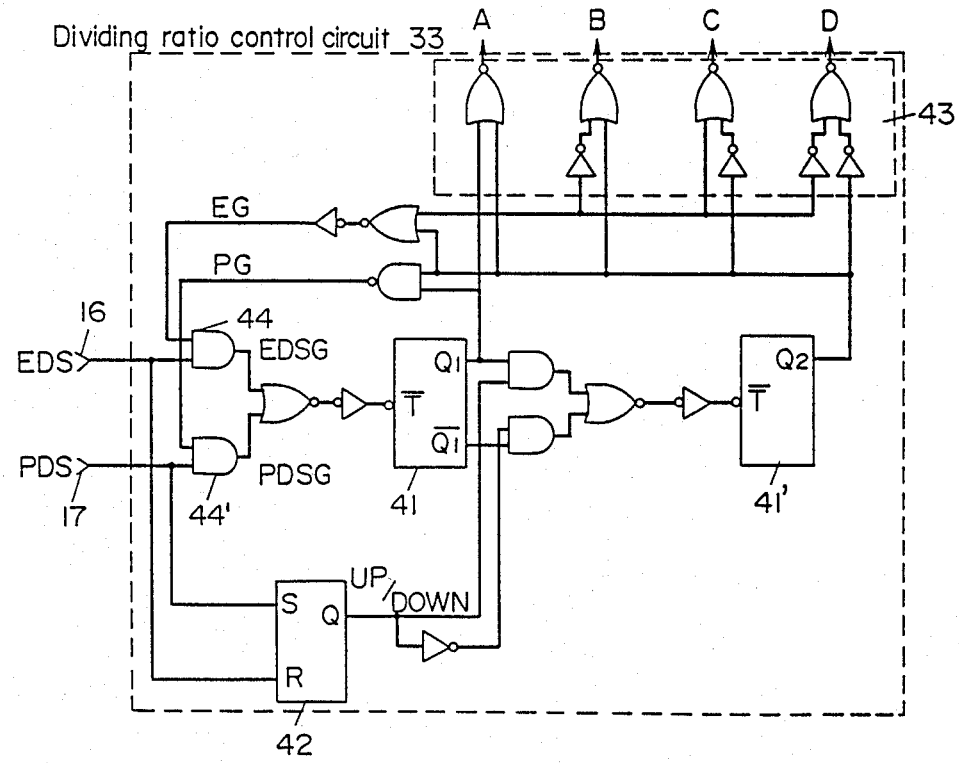
FIG. 3 is a circuit diagram of a dividing ratio control circuit shown in FIG. 2.

The circuit diagram of the dividing ratio control circuit 33 is shown in FIG. 3. The dividing ratio control circuit 33 is composed of a binary up/down counter which is comprised of T-flip-flops 41, 41', RS-flip-flop 42 and peripheral logic circuits thereof, a decoder 43 for decoding the outputs Q1, Q2 of the T-flip-flops 41, 41' and for generating output signals A, B, C, D, and two AND gates 44, 44' for controlling signals EDSG, PDSG depending on the signals EG, PG generated based on the state of the binary up/down counter outputs Q1, Q2.

Figure 4:
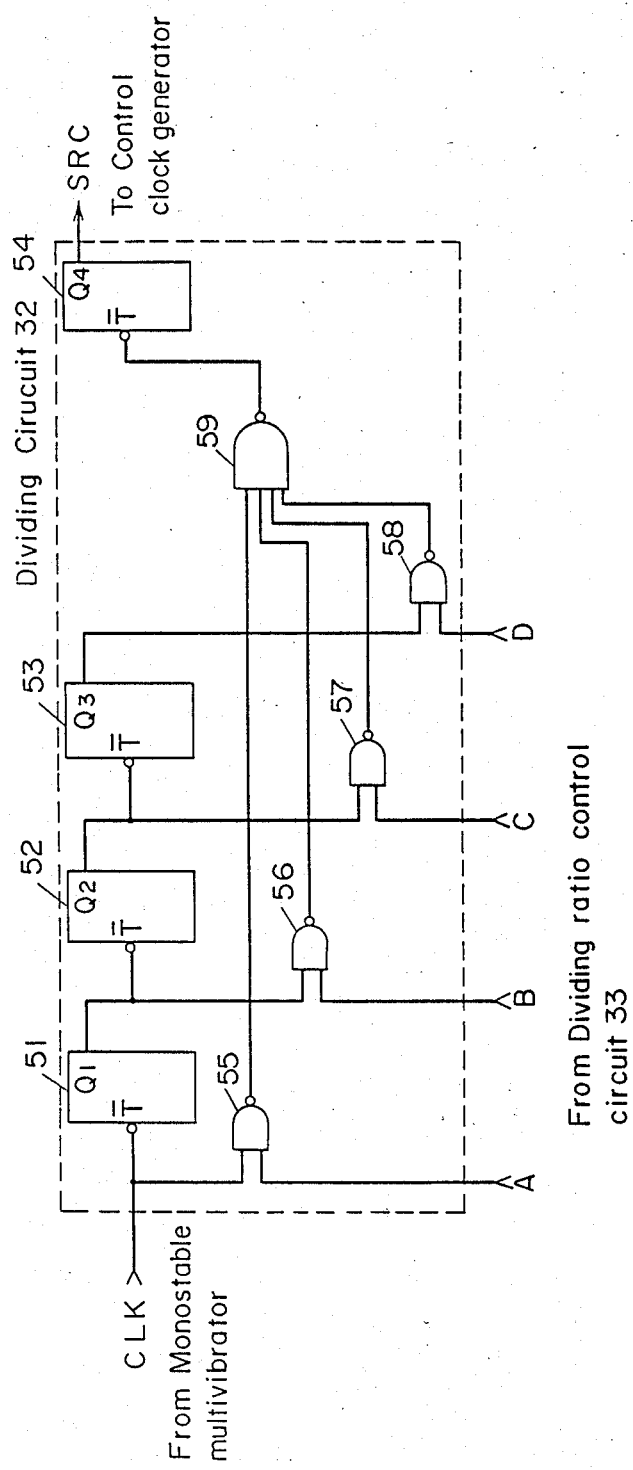
FIG. 4 is a circuit diagram of a dividing circuit shown in FIG. 2.

The dividing circuit 32 is, as shown in FIG. 4, composed of four T-flip-flops 51 to 54, and five NAND gate 55 to 59. The input signal CLK from the monostable multivibrator shown in FIG. 2 is fed into an input terminal of the T-flip-flop 51 of the first stage, and its output Q1 is fed into an input terminal of the T-flip-flop 52 of the second stage. Similarly, the Q2 output of the second stage T-flip-flop 52 is fed into an input terminal of the T-flip-flop 53 of the third stage. The NAND gate 55 receives the input signal CLK and an output signal A of the dividing ratio control circuit 33, and the NAND gates 56 to 58 respectively receive the outputs Q1 to Q3 of T-flip-flops 51 to 53, and output signals B to D of the dividing ratio control circuit 33, and the outputs of all NAND gates 55 to 58 are fed into the NAND gate 59. In consequence, the output of the NAND gate 59 is fed into an input terminal of the T-flip-flop 54 of the final stage, and its output Q4 is supplied into the control clock generator 25 shown in FIG. 1 as self-refreshing clock pulses SRC.

The counter circuit 14 is composed of a binary counter having a cascade connection of N T-flip-flops 61. Receiving a carry signal RCC coming from the MSB (Most Significant Bit) of the error correction address counter 13 shown in FIG. 1, all T-flip-flops 61 are reset by the error detection signal EDS from the error correction circuit 12 shown in FIG. 1. The QN output of the T-flip-flop 61 of the final stage is applied to the self-refreshing clock generator 15 shown in FIG. 1 as the control signal (counter output) PDS.

Below is explained the operation of the self-refreshing circuit of the dynamic random access memory of this embodiment as configured above.

The self-excited self-refreshing clock generator 15 generates self-refreshing clock pulses SRC of period $T_R$. This period $T_R$ varies in response to the error detection signal EDS from the error correction circuit 12 and the counter output PDS from the counter circuit 14. Within this one period $T_R$, the self-refreshing operation is effected as follows.

First, the memory cells corresponding to a row line specified by the refreshing address counter 26 and selected by the row line selection circuit 22 are simultaneously refreshed (read and rewritten) by the sense refreshing amplifier 23. At the same time, one memory cell specified by the error correction address counter 13 and selected by the column selection circuit 11 is selected. The selected memory cell is one of the memory cells corresponding to a row line selected by the row line selection circuit 22. The data read out from the selected memory cell is determined by the error correction circuit 12 to be correct or incorrect, and if it is incorrect, the correct data is written again, and an error detection signal EDS is generated. The refreshing address counter 26 is then incremented, and the row line address to be refreshed is set in the next refreshing cycle. Suppose the memory cell matrix 21 is composed of m row lines by n columns, refreshing of all memory cells is complete in m periods of the self-refreshing cycle, and correction of errors of all memory cells is completed in m×n periods.

Figure 5:
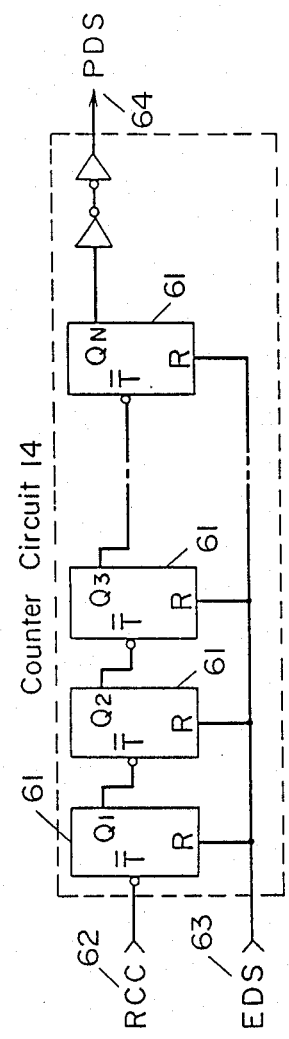
FIG. 5 is a circuit diagram of a counter circuit shown in FIG. 1.
Figure 6:
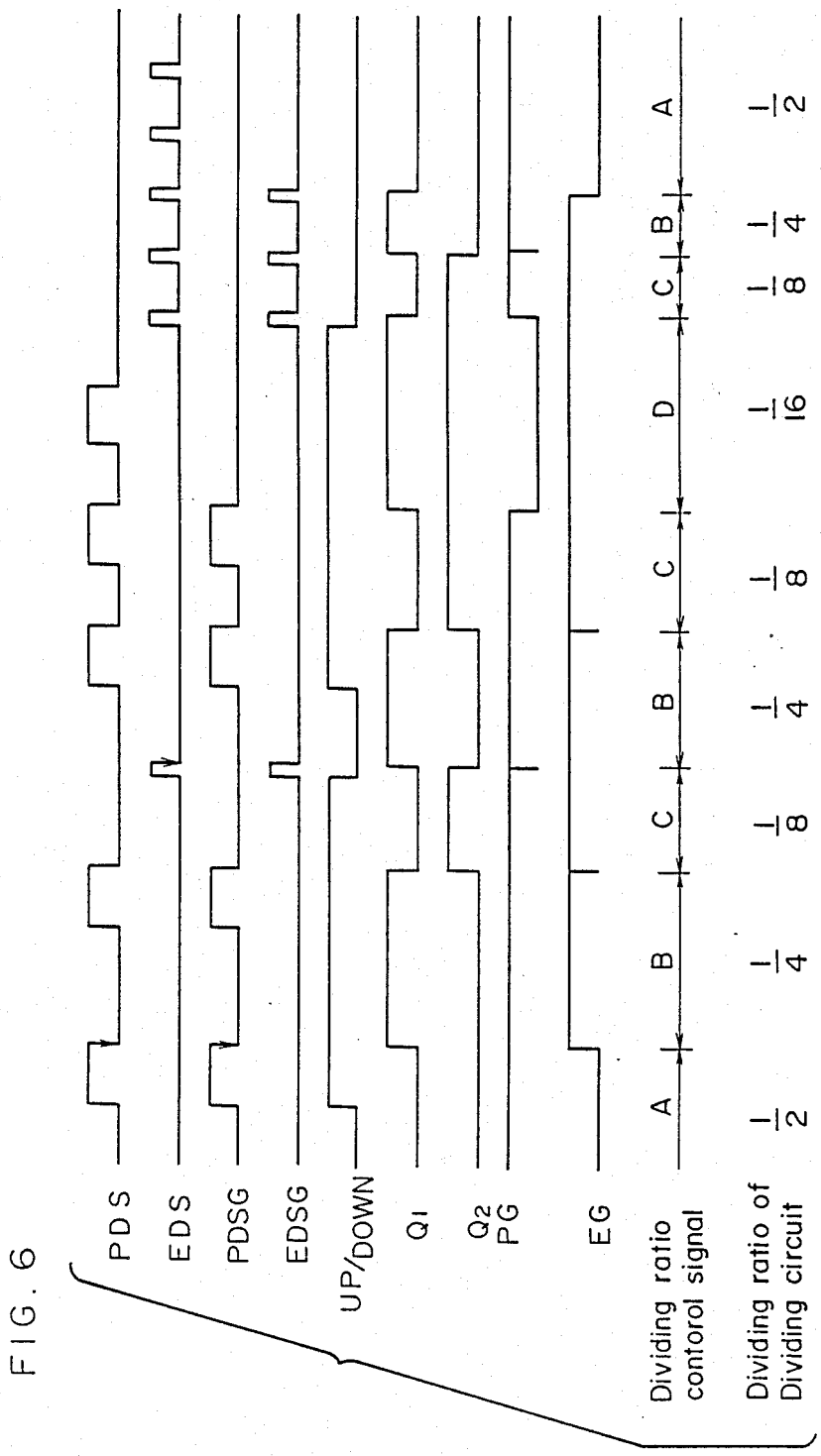
FIG. 6 is a timing chart to explain the operation of the dividing ratio control circuit shown in FIG. 3.

Additionally, the operation of the self-refreshing clock generator 15 is as follows. This self-refreshing clock generator 15 includes a self-activated clock generator (the monostable multivibrator 31 in this embodiment), and the dividing ratio of the output of the monostable multivibrator 31 can be changed from $\frac{1}{2}$ to 1/16 depending on the error detection signal EDS and counter output PDS, so that the period may be varied according to these signals EDS, PDS. When the counter output PDS falls, the dividing ratio is reduced by $\frac{1}{2}$, and when the error detection signal EDS falls, the dividing ratio is increased by a factor of 2. However, if the fall of the counter output PDS is entered more than four times, the minimum dividing ratio does not become smaller than 1/16. Similarly, when the fall of error detection signal EDS is entered more than four times, the dividing ratio will not become more than $\frac{1}{2}$. Therefore, if the period of the output CLK of the monostable multivibrator 31 in FIG. 2 is 100 μs, the self-refreshing clock pulses SRC from the dividing circuit 32 will be any one of 200 μs (minimum period), 400 μs, 800 μs, and 1600 μs (maximum period), and at every one fall of counter output PDS, it increases by a factor of 2 (to the maximum of 1600 μs), and every one fall of error detection signal EDS, it decreased by $\frac{1}{2}$ (to the minimum of 200 μs). The operation timing of the dividing ratio control circuit 33 shown in FIG. 3 is shown in FIG. 6. Signal EG operates to prevent the fall of the error detection signal EDS from being fed into the T-flip-flop functioning as a down counter when the outputs Q1, Q2 of two T-flip-flops 41, 41' are binary 0, so that the outputs Q1, Q2 may not be inverted to 1. Similarly, signal PG works to prevent the fall of the counter output PDS from being fed into the T-flip-flop functioning as an up counter when the outputs Q1, Q2 of T-flip-flops 41, 41' are both binary 1, so that the outputs Q1, Q2 may not be inverted to 0. These outputs Q1, Q2 are decoded by the decoder 43, and dividing ratio control signals A, B, C, D are obtained. One of these dividing ratio control signals is always a binary 1, while others are binary 0, and the dividing ratio of the dividing circuit 32 in FIG. 4 is determined. For example, when signal B is binary 1, and others are binary 0, the output Q1 of the T-flip-flop 51 is entered in the T input of the T-flip-flop 54, so that the dividing ratio is $\frac{1}{4}$. When signal A is binary 1, the dividing ratio is $\frac{1}{2}$, and when D is 1, it is 1/16. In this way, the period $T_R$ of the self-refreshing clock 15 varies in response to the error detection signal EDS and counter output PDS. An error detection signal EDS occurs when there is an error in the data during the self-refreshing cycle. Therefore, while executing self-refreshing in a certain period $T_R$, every time an error occurs, $T_R$ decreases by one half. On the other hand, the counter output PDS is the output of dividing the carry signal RCC coming from the MSB of the error correction address counter 13 by the counter shown in FIG. 5. Therefore, supposing the number of stages of the counter circuit 14 to be N, so long as there is no error in the data being read out in the period of m×n×$2^N$, the counter output PDS rises once and falls once. Accordingly, if there is no error in the data for a period of m×n×$2^N$, the period $T_R$ becomes 2 times longer.

Thus, in this embodiment, since the self-refreshing clock period $T_R$ can be controlled by the error detection signal EDS and counter output PDS, self-refreshing can be executed in the period $T_R$, suited to the actual value of the pause time $T_H$ of the memory cell. For example, when the ambient temperature decreases by 10° C. and the pause time $T_H$ doubles, the counter output PDS is generated, and the self-refreshing period is also increased by a factor of 2. In this way, if the pause time $T_H$ varies, self-refreshing action can be executed always at a value close to the maximum value of the period $T_R$, so that the current consumption may be reduced greatly as compared with that of the conventional fixed period type. Furthermore, in the conventional method, since the refreshing clock period $T_R$ was determined at the upper limit of the operating temperature range, malfunctions occurred if that temperature is exceeded. In this embodiment, by contrast, since the refreshing clock period $T_R$ changes to become shorter, there is no risk of malfunction, and it is possible to extend the upper limit of the operating temperature range without increasing the self-refreshing current at the temperature in usual operation.

In this embodiment, meanwhile, the dividing ratio of self-refreshing clock is set at $\frac{1}{2^k}$ (where k is 1, 2, 3, 4), but the change of the dividing ratio may be set finer by increasing the number of the stages of flip-flop or extending the range of dividing ratio. Furthermore, the control signal PDS is generated by the counter circuit 14, but it may be also generated by the timer circuit which delivers a signal when an error does not occur for a predetermined period. In the above-mentioned embodiment, the clock period of the self-refreshing clock 15 is varied by using the error detection signal EDS generated from the error correction circuit 12.

However, for simplifying the circuit structures, it is also possible, as another embodiment, to use in place of error correction circuit 12 in the foregoing embodiment, an error detection circuit which generates an error detection signal such that the period of self-refreshing clock is varied by using this error detection signal from the error detection circuit.

The effect of current decrease at the time of self-refreshing is also achieved in this other embodiment. And in this other embodiment, the error correction may be made by an external error correction circuit.

Thus, according to this invention, by installing a self-refreshing clock generator capable of varying the period by the control signal generated in the error correction circuit, self-refreshing can be executed in a self-refreshing period close to the maximum acceptable level depending on the actual pause time value even if the pause time of the memory cell varies significantly depending on the manufacturing process condition, so that the current consumption in the self-refreshing time can be decreased. Furthermore, even if the operating conditions change or the pause time of the memory cell should vary, it is always possible to operate in the maximum self-refreshing period depending on the conditions. Still furthermore, the upper limit of the operating temperature condition can be increased without increasing the self-refreshing current at the ordinary operating temperature.

What is claimed is:

1. A dynamic random access memory with a self-refreshing function comprising:
   a memory cell matrix having a plurality of memory cells arranged in a matrix form having a plurality of rows and columns;
   row line selection circuit and column line selection circuit for selecting any one of the rows and columns of said memory cell matrix;
   a sense refreshing amplifier for reading out the data in the memory cells in said memory cell matrix selected by said row line selection circuit and for rewriting data into the same memory cells to effect refreshing of the memory cells;
   an error correction circuit for detecting and correcting an error in the data in a memory cell among said memory cells selected by said row line selection circuit and column line selection circuit;
   address counter means for storing the address of the row and column of a memory cell to be refreshed and corrected, and for supplying said row line selection circuit and said column line selection circuit with said address;
   a self-refreshing clock for generating self-refreshing clock pulses for determining a period of a refresh cycle to be executed repeatedly, wherein said period is variable;
   a control clock generator for receiving self-refreshing clock pulses from said self-refreshing clock generator, and for supplying a series of control clock pulses to said address counter means, row line selection circuit, column line selection circuit, sense refreshing amplifier and error correction circuit; and
   control means for controlling a clock period of said self-refreshing clock generator in response to an error detection signal delivered from said error correction circuit when said error correction circuit detects an error in the data in the memory cell among said memory cells selected by said row line selection circuit and said column line selection circuit.

2. A dynamic random access memory with a self-refreshing function according to claim 1, wherein said control means controls the clock period of said self-refreshing clock generator so as to shorten the clock period of said self-refreshing clock generator every time said error detection signal is generated, and to increase the clock period of said self-refreshing clock generator in the absence of an error in the data for a predetermined period of time.

3. A dynamic random access memory with a self-refreshing function according to claim 1, wherein said control means contains a counter circuit which counts by the output signal coming out from said address counter means storing said column address and is reset by the error detection signal from said error correction circuit, and the clock period of said self-refreshing clock generator is varied by said error detection signal and the output signal of said counter circuit.

4. A dynamic random access memory with a self-refreshing function according to claim 3, wherein said self-refreshing clock generator is composed of a self-excited clock generation source, a dividing circuit for dividing the clock frequency from said clock generation source, and a dividing ratio control circuit for controlling the dividing ratio of said dividing circuit by said error detection signal and the output signal of said counter circuit.

5. A dynamic random access memory with a self-refreshing function according to claim 4, wherein the dividing ratio of the dividing circuit of said self-refreshing clock generator is increased every time said error detection signal is generated, and the dividing ratio of said dividing circuit is decreased by the output of said counter circuit.

6. A dynamic random access memory with a self-refreshing function according to claim 1, wherein said control means contains a timer circuit for generating an output at a predetermined timing, and the clock period of said self-refreshing clock generator is varied by said error detection signal and the output signal of said timer circuit.

7. A dynamic random access memory with a self-refreshing function according to claim 6, wherein said self-refreshing clock generator is composed of a self-exciting clock generation source, a dividing circuit for dividing the output from said clock generation source, and a dividing ratio control circuit for controlling the dividing ratio of said dividing circuit by said error detection signal and the output signal of said timer circuit.

8. A dynamic random access memory with a self-refreshing function according to claim 7, wherein the dividing ratio of the dividing circuit of said self-refreshing clock generator is increased every time said error detection signal is generated, and the dividing ratio of said dividing circuit is decreased by the output signal of said timer circuit.

9. A dynamic random access memory with a self-refreshing function comprising:
   a memory cell matrix having a plurality of memory cells arranged in a matrix form;
   refreshing means for reading and rewriting the data of memory cells in said memory cell matrix;
   error correction means for detecting and correcting an error in the data of said memory cell during operation of said refreshing means;
   clock generating means for generating clock pulses for determining a period of a refresh cycle to be executed repeatedly wherein said period is variable, and for supplying said refreshing means and error correction means with said clock pulses; and
   control means for controlling a period of said clock generating means in response to an error detection signal generated when said error correction means detects an error in the data.

10. A dynamic random access memory with a refreshing function according to claim 9, wherein said control means controls the clock period of said self-refreshing clock generator so as to shorten the clock period of said clock generating means every time said error detection signal is generated, and to increase the clock period of said clock generating means in the absence of an error in the data for a predetermined period of time.

11. A dynamic random access memory with a self-refreshing function comprising:
   a memory cell matrix having a plurality of memory cells arranged in a matrix form;
   refreshing means for reading and rewriting the data of memory cells in said memory cell matrix;
   error detection means for detecting an error in data in the memory cell during refreshing action by said refreshing means;

clock generating means for generating clock pulses for determining a period of a refresh cycle to be executed repeatedly wherein said period is variable, and for supplying said refreshing means and error detection means with said clock pulses; and control means for controlling the clock period of said clock generating means in response to an error detection signal generated by said error detection means.

12. A dynamic random access memory with a self-refreshing function according to claim 11, wherein said control means controls the clock period of said self-refreshing clock generator so as to shorten the clock period of said clock generating means every time said error detection signal is generated, and to increase the clock period of said clock generating means in the absence of an error in the data for a predetermined period of time.

* * * * *

UNITED STATES PATENT AND TRADEMARK OFFICE
CERTIFICATE OF CORRECTION

PATENT NO. : 4,935,900

DATED : June 19, 1990

INVENTOR(S) : Akira OHSAWA

It is certified that error appears in the above-identified patent and that said Letters Patent is hereby corrected as shown below:

In the Abstract, line 21, change "values" to -- varies --.

Column 7, line 27, after "clock" insert -- generator --.

Signed and Sealed this

Eighth Day of October, 1991

*Attest:*

HARRY F. MANBECK, JR.

*Attesting Officer*      *Commissioner of Patents and Trademarks*